United States Patent
Mizuno et al.

(10) Patent No.: US 8,093,159 B2
(45) Date of Patent: Jan. 10, 2012

(54) MANUFACTURING METHOD OF SEMICONDUCTOR DEVICE, AND SEMICONDUCTOR DEVICE

(75) Inventors: Norikazu Mizuno, Toyama (JP); Kenji Kanayama, Toyama (JP); Kazuyuki Okuda, Toyama (JP); Yoshiro Hirose, Toyama (JP); Masayuki Asai, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 303 days.

(21) Appl. No.: 12/201,606

(22) Filed: Aug. 29, 2008

(65) Prior Publication Data

US 2009/0278235 A1    Nov. 12, 2009

(30) Foreign Application Priority Data

May 9, 2008 (JP) .................................. 2008-123738

(51) Int. Cl.
| H01L 21/31 | (2006.01) |
| H01L 21/469 | (2006.01) |
| H01L 29/06 | (2006.01) |
| H01L 21/00 | (2006.01) |
| G03F 7/00 | (2006.01) |

(52) U.S. Cl. ................ 438/770; 257/618; 257/E29.001; 430/312; 430/313

(58) Field of Classification Search ........................ None
See application file for complete search history.

(56) References Cited

U.S. PATENT DOCUMENTS

| 6,015,650 A | 1/2000 | Bae | |
| 6,593,077 B2 * | 7/2003 | Faur et al. ..................... | 438/770 |
| 2007/0287101 A1 * | 12/2007 | Kim et al. ..................... | 430/313 |

FOREIGN PATENT DOCUMENTS

| JP | 8339950 | 12/1996 |
| KR | 100206597 | 7/1999 |
| KR | 20050117574 | 12/2005 |
| KR | 20060106104 | 10/2006 |

OTHER PUBLICATIONS

KR 100206597 (corresponds to U.S. Patent No. 6,015,650).

* cited by examiner

*Primary Examiner* — Ha Tran T Nguyen
*Assistant Examiner* — Valerie N Brown
(74) *Attorney, Agent, or Firm* — Brundidge & Stanger, P.C.

(57) ABSTRACT

Provided is a manufacturing method of a semiconductor device, which is capable of realizing fine-pitch patterns and thus improving stabilization of patterning precision. The manufacturing method of the semiconductor device comprises forming a first photoresist pattern in a predetermined region on a substrate, depositing a thin film on the surface of the first photoresist pattern, and forming a second photoresist pattern in a region where the first photoresist pattern is not formed.

30 Claims, 7 Drawing Sheets

MANUFACTURING METHOD OF SEMICONDUCTOR DEVICE, AND SEMICONDUCTOR DEVICE

CROSS-REFERENCE TO RELATED PATENT APPLICATION

This U.S. non-provisional patent application claims priority under 35 U.S.C. §119 of Japanese Patent Application No. 2008-123738, filed on May 9, 2008, in the Japanese Patent Office, the entire contents of which are hereby incorporated by reference.

BACKGROUND OF THE INVENTION

1. Field of the Invention

The present invention relates to a manufacturing method of a semiconductor device, for example, a method for forming a pattern of a semiconductor device by using a double patterning technology, and a semiconductor device.

2. Description of the Prior Art

Memory devices such as flash memory, Dynamic Random Access Memory (DRAM) and Static Random Access Memory (SRAM), or semiconductor devices such as logic device, in recent years, are required to be highly integrated, and therefore miniaturization of patterns is essential. To integrate a lot of devices in a small area, the individual devices should be formed in small size, and therefore both the line width of the pattern to be formed and the fine pitch of spacing thereof should be made small. However, since a photolithography process for forming a desired pattern is limited in resolution, there is a limitation in forming a pattern with a fine pitch.

In recent years, technology (pattern forming technology), which forms a fine pattern on a substrate and processes an under layer of the pattern through an etching process by using the pattern as a mask, is widely applied in IC fabrication of semiconductor industry and attracts a great attention. Therefore, as one of lithography technologies which have been newly proposed, a double patterning method, which forms a photoresist pattern by performing a patterning two or more times, is under investigation. According to this double patterning method, it is considered that a pattern can be formed more finely than a pattern formed by one-time patterning, and, as an example, technology which performs an exposure two or more times is under investigation.

In the double patterning method, in order to form a second photoresist pattern on a first photoresist pattern, it is required to establish a process which does not cause any damage to the first photoresist pattern during the formation of the second photoresist pattern. Specifically, it is required to develop a process technology which overcomes the following problems: (1) deterioration of resistor property, which is caused when a solvent contained in a photoresist penetrates the first photoresist pattern during the formation of the second photoresist pattern; (2) deformation of the first photoresist pattern by a thermal treatment applied during the second photoresist processing (a typical resin-based photoresist material is deformed if it is heated above 150° C.); (3) occurrence of misalignment from a resistor dimension of the first photoresist pattern in a development process during the formation of the second photoresist pattern (practically, a development time becomes as long as a processing time of the second photoresist, thus causing the misalignment from a desired resistor dimension); and (4) occurrence of damage to the first photoresist when rework of the second photoresist processing occurs.

SUMMARY OF THE INVENTION

A major object of the present invention is to provide a manufacturing method of a semiconductor device, which is capable of maintaining the stability of patterning precision in a double patterning technology where a second photoresist forming process has no adverse effects such as the above (1) to (4) on a first photoresist.

According to an aspect of the present invention, there is provided a manufacturing method of the semiconductor device, comprising: forming a first photoresist pattern in a predetermined region on a substrate; depositing a thin film on the surface of the first photoresist pattern; and forming a second photoresist pattern in a region where the first photoresist pattern is not formed.

According to another aspect of the present invention, there is provided a photoresist pattern forming method, comprising: forming a first photoresist pattern in a predetermined region on a substrate; depositing a thin film on the surface of at least the first photoresist pattern; and forming a second photoresist pattern in a region where the first photoresist pattern is not formed.

According to another aspect of the present invention, there is provided a semiconductor device, manufactured by performing an etching process by using the first photoresist pattern and the second photoresist pattern, which are formed by the photoresist pattern forming method, as a mask, and performing a desired process on the substrate by processing under films of the first photoresist pattern and the second photoresist pattern.

DETAILED DESCRIPTION OF THE PREFERRED EMBODIMENTS

Explanation will be given below on preferred embodiments of the present invention with reference to drawings. A substrate processing apparatus relevant to the present embodiment is configured as an example of a semiconductor manufacturing apparatus used in fabrication of a semiconductor device (IC). In the following explanation, as an example of the substrate processing apparatus, explanation will be given on the case of using a vertical type apparatus which performs a film forming process or the like on a substrate. However, the present invention is not premised on the use of the vertical type apparatus, and may use, for example, a single wafer type apparatus. In addition, a film forming mechanism is not limited to a $SiO_2$ film, which is combination of a Si material, an oxidation material and a catalyst, and can apply a low-temperature film forming technology, for example, a film forming technology using light energy.

Figure 1:
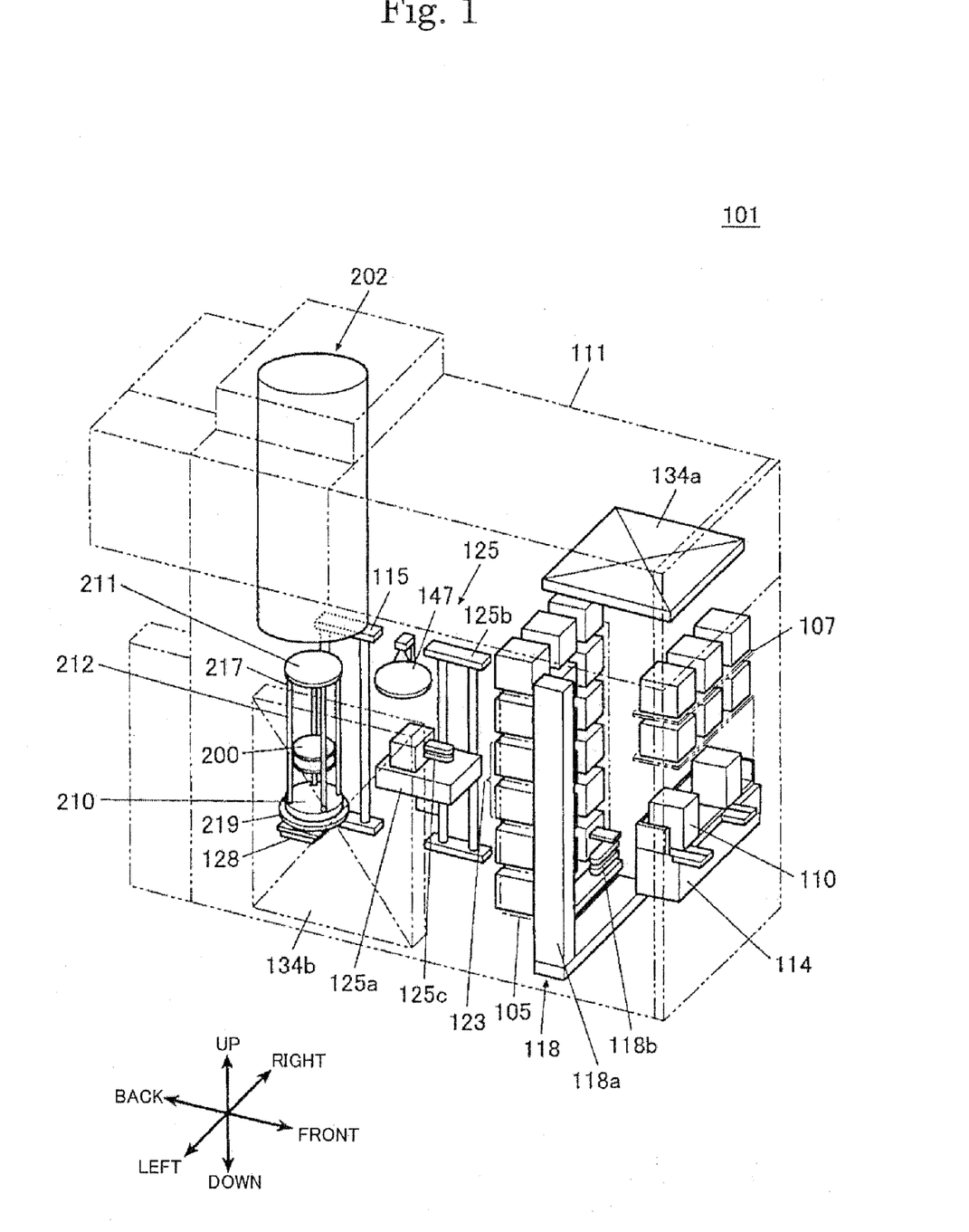
FIG. 1 is a perspective view showing schematic configuration of a substrate processing apparatus, relevant to a preferred embodiment of the present invention.

As shown in FIG. 1, in a substrate processing apparatus 101, a cassette 110 storing a wafer 200, which is an example of a substrate, is used, and the wafer 200 is made of a material such as silicon. The substrate processing apparatus 101 is provided with a housing 111, and a cassette stage 114 is installed at the inside of the housing 111. The cassette 110 is designed to be carried in on a cassette stage 114, or carried out from the cassette stage 114, by an in-plant carrying unit (not shown).

The cassette stage 114 is installed so that the wafer 200 maintains a vertical position inside the cassette 110, and a wafer carrying-in and carrying-out opening of the cassette 110 faces an upward direction, by the in-plant carrying unit. The cassette stage 114 is configured so that the cassette 110 is rotated 90 degrees counterclockwise in a longitudinal direction to backward of the housing 111, and the wafer 200 inside the cassette 110 takes a horizontal position, and the wafer carrying-in and carrying-out opening of the cassette 110 faces the backward of the housing 111.

Near to the center portion inside the housing 111 in a front and back direction, a cassette shelf 105 is installed to store a plurality of cassettes 110 in a plurality of stages and a plurality of rows. At the cassette shelf 105, a transfer shelf 123 is installed to store the cassettes 110 which are carrying objects of a wafer transfer mechanism 125.

At the upward of the cassette stage 114, a standby cassette shelf 107 is installed to store a standby cassette 110.

Between the cassette stage 114 and the cassette shelf 105, a cassette carrying unit 118 is installed. The cassette carrying unit 118 is configured by a cassette elevator 118a, which is capable of holding and moving the cassette 110 upward and downward, and a cassette carrying mechanism 118b as a carrying mechanism. The cassette carrying unit 118 is designed to carry the cassette 110 in and out of the cassette stage 114, the cassette shelf 105, and/or the standby cassette shelf 105 by continuous motions of the cassette elevator 118a and the cassette transfer mechanism 118b.

At the backward of the cassette shelf 105, the wafer transfer mechanism 125 is installed. The wafer transfer mechanism 125 is configured by a wafer transfer unit 125a, which is capable of horizontally rotating or straightly moving the wafer 200, and a wafer transfer unit elevator 125b for moving the wafer transfer unit 125a upward and downward. At the wafer transfer unit 125a, tweezers 125c for picking up the wafer 200 is installed. By the continuous operation of the wafer transfer unit 125a and the wafer transfer unit elevator 125b, the wafer transfer mechanism 125 is configured to charge or discharge the wafer 200 into/from a boat 217, with the tweezers 125c as a placement part of the wafer 200.

At the upward of the rear portion of the housing 111, a processing furnace 202 for thermally processing the wafer 200 is installed, and the lower end portion of the processing furnace 202 is configured to be opened and closed by a throat shutter 147.

At the downward of the processing furnace 202, a boat elevator 115 is installed to elevate the boat 217 in the processing furnace 202. An arm 128 is connected to an elevating table of the boat elevator 115, and a seal cap 219 is horizontally attached to the arm 128. The seal cap 219 is configured to vertically support the boat 217 and, at the same time, close the lower end portion of the processing furnace 202.

The boat 217 is installed with a plurality of holding members, and is configured to horizontally hold a plurality of sheets (for example, from about 50 to 150 sheets) of wafers 200 in a state of being vertically arranged, with their centers aligned.

At the upward of the cassette shelf 105, a clean unit 134a is installed for supplying clean air, that is, purified atmosphere. The clean unit 134a is configured by a supply fan and a dust-proof filter, so as to flow clean air through the inside of the housing 111.

At the left end portion of the housing 111, a clean unit 134b is installed for supplying clean air. The clean air unit 134b is also configured by a supply fan and a dust-proof filter, so that the clean air blown from the clean unit 134b flows through the surrounding area of the wafer transfer unit 125a, and the boat 217 and the like, and then is exhausted to the outside of the housing 111.

Then, explanation will be given on main operation of the substrate processing apparatus 101.

When the cassette 110 is carried in onto the cassette stage 114 by the in-plant carrying unit (not shown), the cassette 110 is mounted so that the wafer 200 is held in a vertical position, and the wafer carrying-in and carrying-out opening of the cassette 110 faces an upward direction. Thereafter, the cassette 110 is rotated, by the cassette stage 114, 90 degrees counterclockwise in a longitudinal direction, so that the wafer 200 inside the cassette 110 takes a horizontal position, and the wafer carrying-in and carrying-out opening of the cassette 110 faces the backward of the housing 111.

Then, the cassette 110 is automatically carried and placed at a specific shelf position of the cassette shelf 105 or the standby cassette shelf 107 by the cassette carrying unit 118, and stored temporarily and transferred to the transfer shelf 123 from the cassette shelf 105 or the standby cassette shelf 107 by the cassette carrying unit 118, or directly transferred to the transfer shelf 123.

When the cassette 110 is transferred to the transfer shelf 123, the wafer 200 is picked up from the cassette 110 through the wafer carrying-in and carrying-out opening by the tweezers 125c of the wafer transfer unit 125a, and is charged into the boat 217. The wafer transfer unit 125a, which delivers the wafer 200 to the boat 217, returns to the cassette 110 and charges the next wafer 200 into the boat 217.

When predetermined sheets of the wafers 200 are charged into the boat 217, the lower end portion of the processing furnace 202, which was kept closed by the throat shutter 147, is opened by the throat shutter 147. Subsequently, the boat 217 holding a group of wafers 200 is loaded into the processing furnace 202 by the elevating motion of the boat elevator 115, and the lower end portion of the processing chamber 202 is closed by the seal cap 219.

After the loading, an optional processing is applied to the wafer 200 in the processing furnace 202. After the processing, the wafer 200 and the cassette 110 are carried out of the housing 111 in a reverse sequence of the above.

Figure 2:
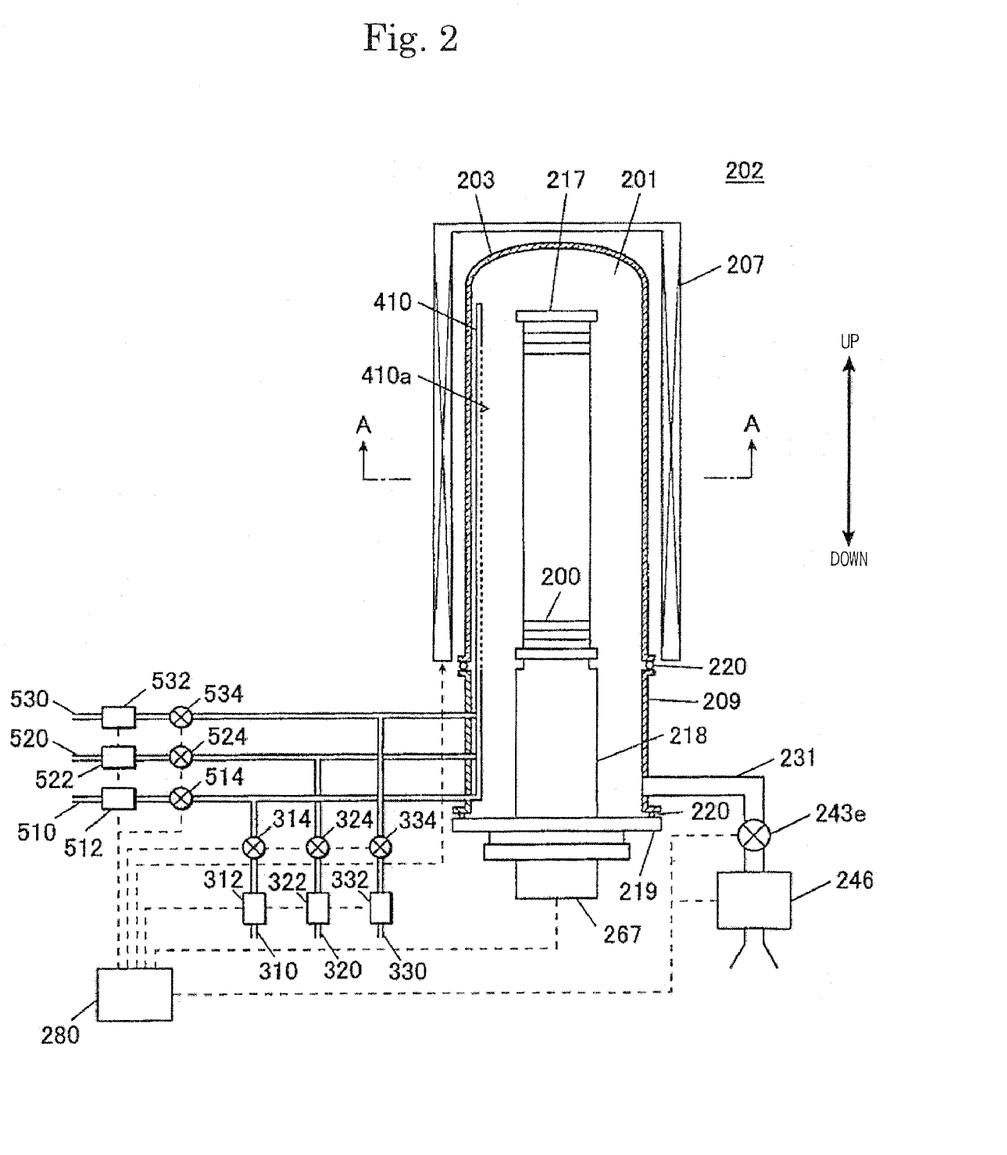
FIG. 2 is a diagram showing schematic configuration of a vertical type processing furnace and members accompanying therewith used in the preferred embodiment of the present invention, and in particular, a longitudinal cross-sectional view of the processing furnace part.
Figure 3:
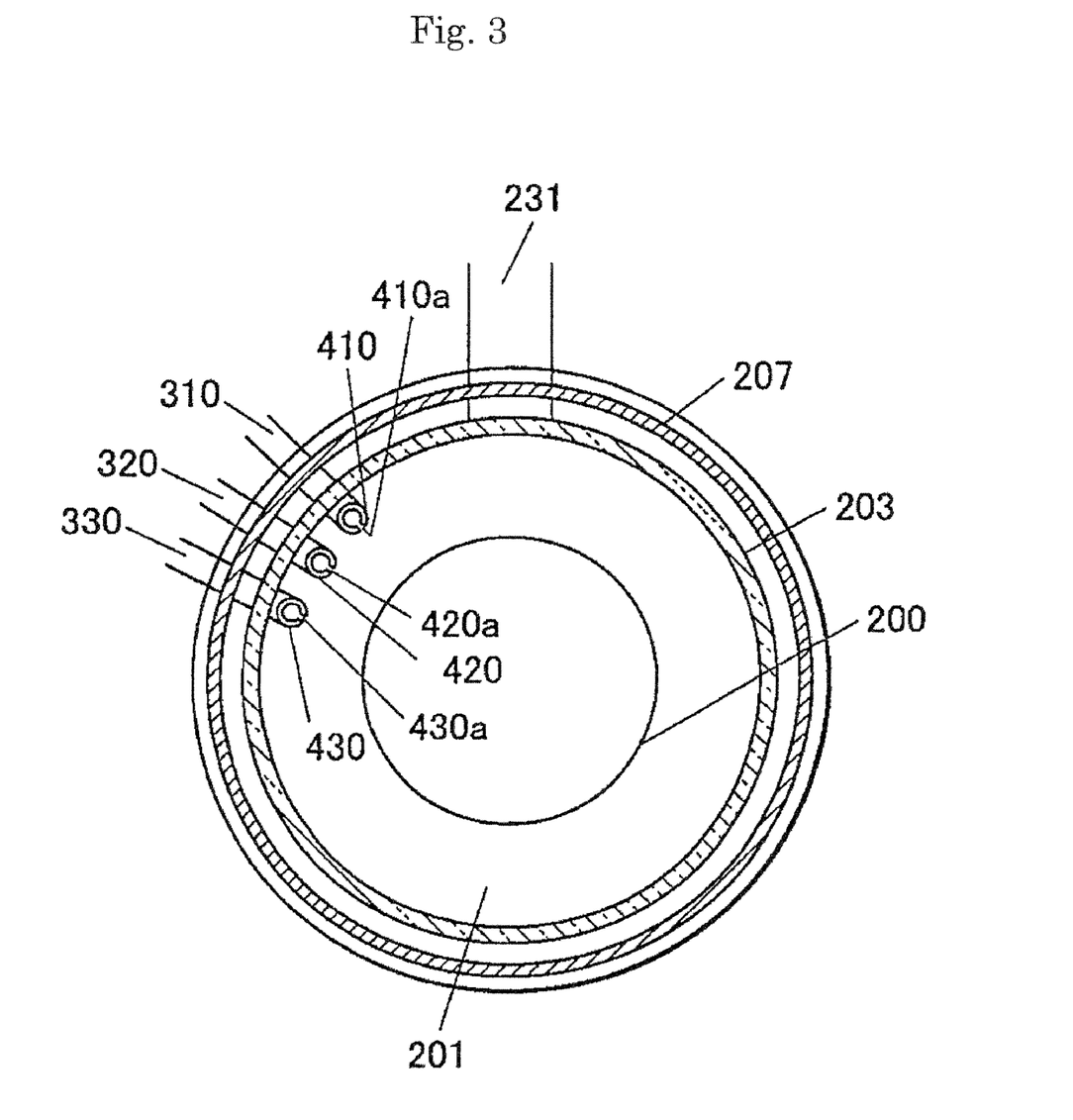
FIG. 3 is a cross-sectional view taken along the A-A line of FIG. 2.

As shown in FIG. 2 and FIG. 3, at the processing furnace 202, a heater 207 for heating the wafer 200 is installed. The heater 207 includes a cylindrical insulation member with its upward being closed, and a plurality of heater wires, and has a unit configuration where the heater wires are installed around the insulation member. At the inside of the heater 207, a reaction tube 203 made of quartz is installed for processing the wafer 200.

At the lower end portion of the reaction tube 203, a manifold 209 made of stainless steel or the like is installed via an O-ring 220 which is a sealing member. The lower opening of the manifold 209 is air-tightly blocked via the O-ring 220 by a seal cap 219 which is a cap body. In the processing furnace 202, a processing chamber 201 is formed by at least the reaction tube 203, the manifold 209 and the seal cap 219.

At the seal cap 219, a boat support stand 218 is installed for supporting the boat 217. As shown in FIG. 1, the boat 217 includes a bottom plate 210, which is fixed to the boat support stand 218, and a top plate 211, which is installed above the bottom plate 210, and a plurality of supporters 212 are installed between the bottom plate 210 and the top plate 211. At the boat 217, a plurality of wafers 200 are held and supported by the supporters 212 of the boat 217, in a state that the wafers 200 are arranged at constant spacing and maintained in a horizontal position.

At the above processing furnace 202, in a state that a plurality of wafers 200 to be subjected to batch processing are piled in multiple stages, the boat 217 is supported by the boat support stand 218 and inserted into a processing chamber 201, and the heater 207 heats the wafers 200 inserted in the processing chamber 201 up to a predetermined temperature.

As shown in FIG. 2 and FIG. 3, two source gas supply pipelines 310 and 320 for supplying source gas, and a catalyst supply pipeline 330 for supplying catalyst are connected to the processing chamber 201.

At the source gas supply pipeline 310, a mass flow controller 312 and a valve 314 are installed. At the front end portion of the source gas supply pipeline 310, a nozzle 410 is connected. The nozzle 410 extends in an up-and-down direction along an inner wall of the reaction tube 203, in an arc-shaped space between the inner wall of the reaction tube 203 constituting the processing chamber 201, and the wafer 200. At the side surface of the nozzle 410, a plurality of gas supply holes 410a for supplying source gas are formed. The gas supply holes 410a each have the same or gradually-varying opening area and are formed in the same opening pitch from the lower portion to the upper portion.

Furthermore, at the source gas supply pipeline 310, a carrier gas supply pipeline 510 for supplying carrier gas is connected. At the carrier gas supply pipeline 510, a mass flow controller 512 and a valve 514 are installed.

At the source gas supply pipeline 320, a mass flow controller 322 and a valve 324 are installed. At the front end portion of the source gas supply pipeline 320, a nozzle 420 is connected. In the same manner as the nozzle 410, the nozzle 420 extends in an up-and-down direction along the inner wall of the reaction tube 203, in an arc-shaped space between the inner wall of the reaction tube 203 constituting the processing chamber 201, and the wafer 200. At the side surface of the nozzle 420, a plurality of gas supply holes 420a for supplying source gas are formed. In the same manner as the gas supply holes 410a, the gas supply holes 420a each have the same or gradually-varying opening area and are formed in the same opening pitch from the lower portion to the upper portion.

Furthermore, at the source gas supply pipeline 320, a carrier gas supply pipeline 520 for supplying carrier gas is connected. At the carrier gas supply pipeline 520, a mass flow controller 522 and a valve 524 are installed.

At the catalyst supply pipeline 330, a mass flow controller 332 and a valve 334 are installed. At the front end portion of the catalyst supply pipeline 330, a nozzle 430 is connected. In the same manner as the nozzle 410, the nozzle 430 extends in an up-and-down direction along the inner wall of the reaction tube 203, in an arc-shaped space between the inner wall of the reaction tube 203 constituting the processing chamber 201, and the wafer 200. At the side surface of the nozzle 430, a plurality of catalyst supply holes 430a for supplying catalyst are formed. In the same manner as the gas supply holes 410a, the catalyst supply holes 430a each have the same or gradually-varying opening area and are formed in the same opening pitch from the lower portion to the upper portion.

Furthermore, at the catalyst supply pipeline 330, a carrier gas supply pipeline 530 for supplying carrier gas is connected. At the carrier gas supply pipeline 530, a mass flow controller 532 and a valve 534 are installed.

As an example relevant to the above configuration, a Si material [TDMAS:trisdimethylaminosilane, $SiH(N(CH_3)_2)_3$, DCS: dichlorosilane, $SiH_2Cl_2$, HCD:hexachlorodisilane, $Si_2Cl_6$ or TCS: tetrachlorosilane, $SiCl_4$], as an example of a source gas, is introduced into the source gas supply pipeline 310. $H_2O$ or $H_2O_2$ as an example of an oxidation material is introduced into the source gas supply pipeline 320. Pyridine ($C_5H_5N$), pyrimidine ($C_4H_4N_2$), or quinoline ($C_9H_7N$) as an example of catalyst is introduced into the catalyst supply pipeline 330.

At the processing chamber 201, an exhaust pipeline 231 is connected via a valve 243e so as to exhaust the inside of the processing chamber 201. At the exhaust pipeline 231, a vacuum pump 246 is connected and configured to vacuum-exhaust the inside of the processing chamber 201 by operation of the vacuum pump 246. The valve 243e is an open-close valve which enables not only to evacuate the processing chamber 201, or stop evacuation of the processing chamber 201 by opening and closing the value, but also adjust pressure inside the processing chamber 201 by adjusting valve opening.

At the center portion of the reaction tube 203, the boat 217 is installed. The boat 217 can be moved upward and downward (entered and exited) into/from the reaction tube 203 by the boat elevator 115. At the lower end portion of the boat support stand 218 supporting the boat 217, a boat rotating mechanism 267 for rotating the boat 217 is installed so as to improve processing uniformity. By driving the boat rotating mechanism 267, the boat 217 supported by the boat support stand 218 is rotated.

A controller 280 is connected to the mass flow controllers 312, 322, 332, 512, 522 and 532, the valves 314, 324, 334, 514, 524 and 534, the valve 243e, the heater 207, the vacuum pump 246, the boat rotating mechanism 267 and the boat elevator 115. The controller 280 is an example of a control unit for controlling an overall operation of the substrate processing apparatus 101, and controls flow rate adjustment of the mass flow controllers 312, 322, 332, 512, 522 and 532, opening and closing operation of the valves 314, 324, 334, 514, 524 and 534, opening/closing and pressure adjustment operation of the valve 243e, temperature adjustment of the heater 207, start and stop of the vacuum pump 246, rotation speed adjustment of the boat rotating mechanism 267, and upward and downward movement of the boat elevator 115.

Next, as an example of a manufacturing method of a semiconductor device, an application of the present invention to fabrication of a large scale integration (LSI) circuit is explained.

After a wafer process, LSI is manufactured through an assembly process, a test process, and a reliability test process. The wafer process is divided into a substrate process, such as oxidation, diffusion and the like on the silicon wafer, and an interconnection process on the surface of the silicon wafer. Cleaning, thermal treatment, and film formation are repeated, based on a lithography process. In the lithography process, a photoresist pattern is formed and an under layer of the pattern is processed through an etching process by using the pattern as a mask.

Figures 4, 4A:
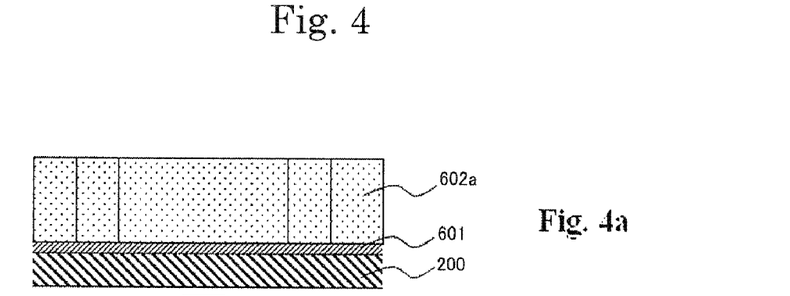
FIG. 4 is a schematic diagram showing formation of a photoresist pattern on a wafer used as a substrate, in a preferred embodiment of the present invention.
Figure 4B:
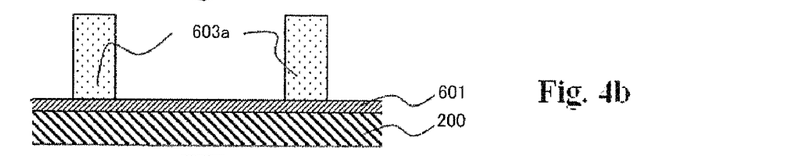
Figure 4C:
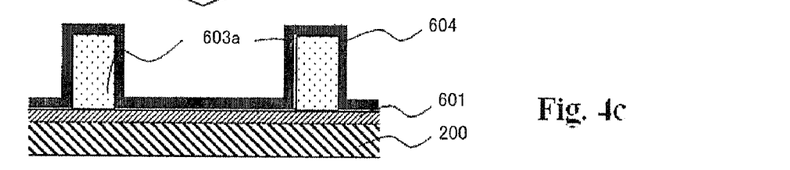
Figure 4D:
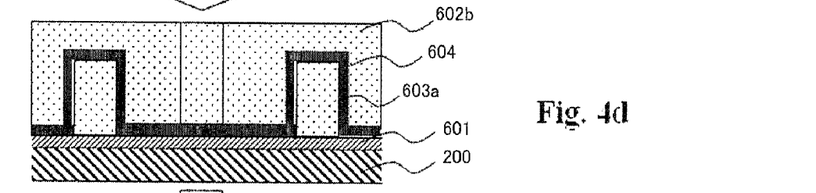
Figure 4E:
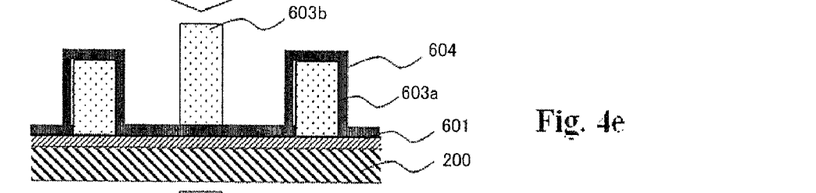
Figure 4F:
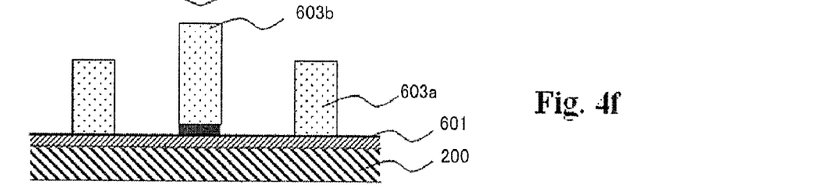

Herein, explanation will be given on an example of a process sequence which forms a photoresist pattern on a wafer 200, with reference to FIG. 4.

In the process sequence, a first photoresist pattern forming process for a first photoresist pattern 603a on a wafer 200, a first photoresist protection film forming process for a thin film as a first photoresist protection film on the first photoresist pattern 603a, and a second photoresist pattern forming process for a second photoresist pattern 603b on the thin film are carried out in the above order. The respective processes will be explained below.

<First Photoresist Pattern Forming Process>

In the first photoresist pattern forming process, the first photoresist pattern 603a is formed on a hard mask 601 formed on the wafer 200. At first, a first photoresist solvent 602a is coated on the hard mask 601 formed on the wafer 200 (FIG. 4a). Thereafter, the first photoresist pattern 603a is formed by baking, selective exposure and development using a mask pattern or the like by light source, such as ArF excimer light source (193 nm) or KrF excimer light source (248 nm) (FIG. 4b).

<First Photoresist Protection Film Forming Process>

In the first photoresist protection film forming process, the thin film is formed as a protection material on the first photoresist pattern 603a, which is formed in the first photoresist pattern forming process, and a region where the first photoresist pattern 603a is not formed. The film deformation or change of the film quality of the first photoresist pattern 603a is prevented by protecting the first photoresist pattern 603a from the penetration of the second photoresist solvent 602a, as described later. Explanation will be given on an example of forming a $SiO_2$ film as a protection film at extremely low temperature by an Atomic Layer Deposition (ALD) method, by using the substrate processing apparatus 101.

The ALD method as a kind of a Chemical Vapor Deposition (CVD) is technology which supplies at least two kinds of source gases alternately under the film forming conditions (temperature, time, and the like), for the substrate to adsorb the source gases with atomic unit and form the film through surface reaction. In this case, the control of film thickness is performed by number of cycles of supplying the source gases (for example, assuming that a film forming speed is 1 Å/cycle, 20 cycles are executed in the case of forming a film of 20 Å).

In the present embodiment, the case of using HCD as a Si material, $H_2O$ as an oxidation material, pyridine as a catalyst, and $N_2$ as a carrier gas will be explained with reference to FIG. 1, FIG. 2 and FIG. 5.

In the film forming process, the controller 280 controls the substrate processing apparatus 101 as follows. That is, by controlling the heater 207, the inside of the processing chamber 201 is maintained at a temperature lower than a deformation temperature of the photoresist film, for example, below 150° C., preferably below 100° C., more preferably 75° C. Thereafter, a plurality of wafers 200 are charged into the boat 217, and the boat 217 is loaded into the processing chamber 201. Thereafter, the boat 217 is rotated by the boat rotating mechanism 267, so that the wafers 200 are rotated. Then, the vacuum pump 246 is operated and, at the same time, the valve 243e is opened to evacuate the inside of the processing chamber 201, and if temperature of the wafer 200 reaches 75° C. and temperature is stabilized, the following four steps are executed sequentially in a state that temperature inside the processing chamber 201 is maintained at 75° C.

(Step 1)

While introducing (flowing) HCD into the source gas supply pipeline 310, $H_2O$ into the source gas supply pipeline 320, catalyst into the catalyst supply pipeline 330, and $N_2$ into the carrier gas supply pipelines 510, 520 and 530, the valves 314, 334, 514, 524 and 534 are opened appropriately. However, the valve 324 is in a closed state.

Figure 5:
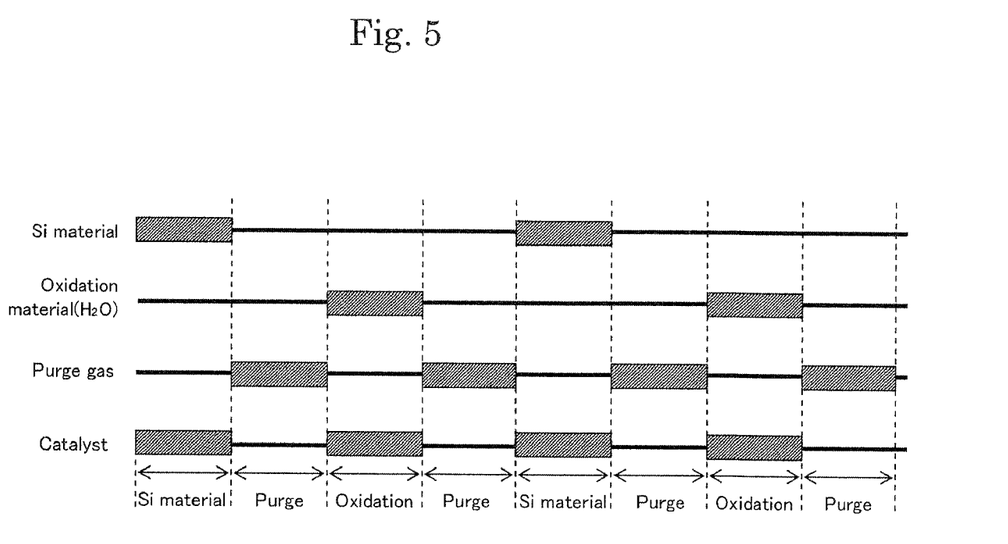
FIG. 5 is a diagram showing schematic main gas supply sequence in the case where a $SiO_2$ film is formed by an Atomic Layer Deposition (ALD) method, in a preferred embodiment of the present invention.

As a result, as shown in FIG. 5, the HCD, while mixing with $N_2$, flows out through the source gas supply pipeline 310 to the nozzle 410, and is supplied from the gas supply hole 410a into the processing chamber 201. In addition, the catalyst, while mixing with $N_2$, flows out through the catalyst supply pipeline 330 to the nozzle 430, and is supplied from the catalyst supply hole 430a into the processing chamber 201. $N_2$ flows out through the carrier gas supply pipeline 520 to the nozzle 420, and is supplied from the gas supply hole 420a into the processing chamber 201. The HCD and the catalyst supplied into the processing chamber 201 pass through the surface of the wafer 200 and are exhausted from the exhaust pipeline 231.

In the above step 1, by controlling the valves 314 and 334, the supply time of the HCD and the catalyst is set to an optimal time (for example, 10 seconds). The valves 314 and 334 are controlled so that the supply amount ratio of the HCD to the catalyst is set to have a predetermined ratio (for example, 1:1). At the same time, by controlling the valve 243e properly, pressure inside the processing chamber 201 is set to have an optimal value (for example, 3 Torr) within a predetermined range. In the above step 1, by supplying the HCD and the catalyst into the processing chamber 201, Si is adsorbed on the first photoresist pattern 603a and the hard mask 601 formed on the wafer 200.

(Step 2)

By closing the valves 314 and 334, the supply of the HCD and the catalyst is stopped. At the same time, as shown in FIG. 5, by continuously supplying $N_2$ from the carrier gas supply pipelines 510, 520 and 530 into the processing chamber 201, the inside of the processing chamber 201 is purged by $N_2$. The purge time is, for example, 15 seconds. Also, the two processes, that is, the purge and the vacuum exhaust, may be executed within 15 seconds. As a result, the HCD and the catalyst remaining inside the processing chamber 201 are discharged from the processing chamber 201.

(Step 3)

In a state that the valves 514, 524 and 534 are opened, the valves 324 and 334 are opened appropriately. The valve 314 is in a closed state. As a result, as shown in FIG. 5, $H_2O$, while mixing with $N_2$, flows out through the source gas supply pipeline 320 to the nozzle 420, and is supplied from the gas supply hole 420a into the processing chamber 201. In addition, the catalyst, while mixing with $N_2$, flows out through the catalyst supply pipeline 330 to the nozzle 430, and is supplied from the catalyst supply hole 430a to the processing chamber 201. Furthermore, $N_2$ flows out through the carrier gas supply pipeline 510 to the nozzle 410, and is supplied from the gas supply hole 410a to the processing chamber 201. $H_2O$ and the catalyst supplied into the processing chamber 201 pass through the surface of the wafer 200 and are exhausted from the exhaust pipeline 231.

In the above step 3, by controlling the valves 324 and 334, the supply time of $H_2O$ and the catalyst are set to an optimal time (for example, 20 seconds). The valves 314 and 334 are controlled so that the supply amount ratio of $H_2O$ to the catalyst is set to have a predetermined ratio (for example, 1:1). At the same time, by controlling the valve 243e properly, pressure inside the processing chamber 201 is set to have an optimal value (for example, 7 Torr) within a predetermined range. In the above step 3, by supplying $H_2O$ and the catalyst into the processing chamber 201, a $SiO_2$ film is formed on the first photoresist pattern 603a and the hard mask 601 formed on the wafer 200.

Necessary property as the oxidation material (material corresponding to $H_2O$) supplied in the above step 3 is that atoms having high electronegativity should be contained in the molecule, and have electrical deflection. The reason is that since electronegativity of the catalyst is high, the catalyst lowers the activation energy of the source gas and accelerates the reaction. Therefore, as the source gas supplied in the above step 3, $H_2O$ or $H_2O_2$ having OH-bond is suitable, whereas nonpolar molecule such as $O_2$ or $O_3$ is unsuitable.

(Step 4)

By closing the valves 324 and 334, the supply of $H_2O$ and the catalyst is stopped. At the same time, as shown in FIG. 5, by continuously supplying $N_2$ from the carrier gas supply pipelines 510, 520 and 530 into the processing chamber 201, the inside of the processing chamber 201 is purged by $N_2$. The purge time is, for example, 15 seconds. Also, the two processes, that is, the purge and the vacuum exhaust, may be executed within 15 seconds. As a result, the $H_2O$ and the catalyst remaining inside the processing chamber 201 are discharged from the processing chamber 201.

Figure 7:
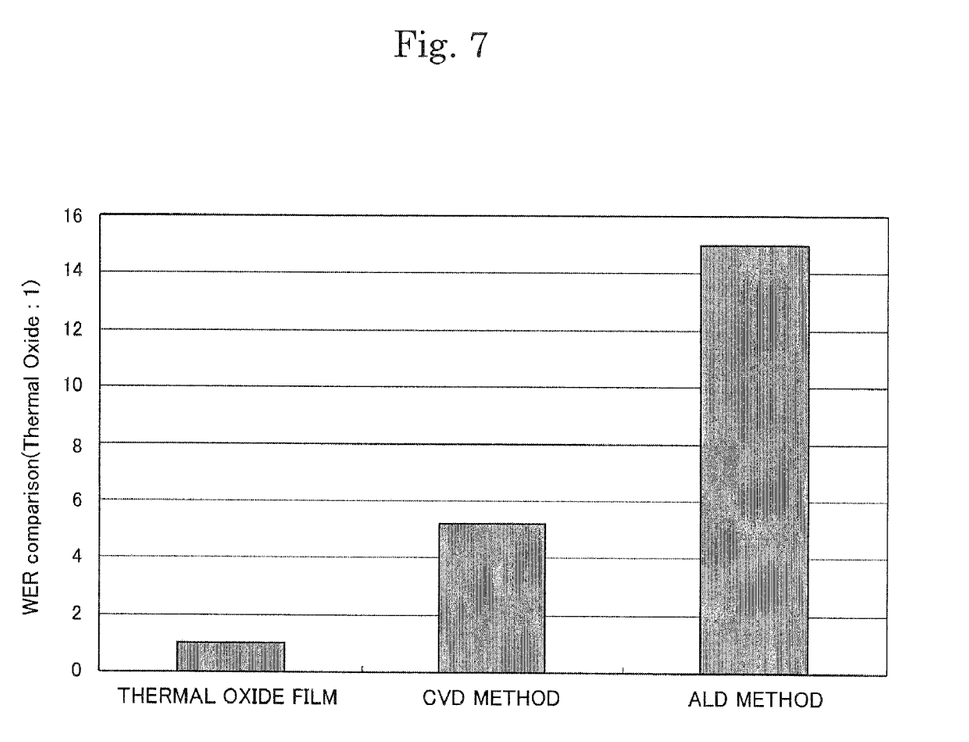
FIG. 7 is a diagram showing a wet etching property of a $SiO_2$ film, in a preferred embodiment of the present invention.

Thereafter, the steps 1 to 4 are set as one cycle, and this cycle is repeated a plurality of times to form a $SiO_2$ film of predetermined thickness on the first photoresist pattern 603a and the hard mask 601 formed on the wafer 200. In this case, among the respective cycles, as explained above, it should be noted in the film formation that an atmosphere configured by the Si material and the catalyst in the step 1, and an atmosphere configured by the oxidation material and the catalyst should not be mixed. Therefore, on the first photoresist pattern 603a and the hard mask 601, the $SiO_2$ film 604 is formed as the first photoresist protection film (FIG. 4c, FIG. 7).

Thereafter, HCD, $H_2O$ and catalyst remaining inside the processing chamber 201 are exhausted by vacuum-exhausting the inside of the processing chamber 201, and the inside of the processing chamber 201 is set to atmospheric pressure by controlling the valve 243a, and the boat 217 is unloaded from the processing chamber 201. In this way, one-time film forming processing (batch processing) is finished.

As the thickness of the $SiO_2$ film 604, about 5%, which is a half pitch (Hp) corresponding to a limit resolution of lithography, is required for the first photoresist protection film. Therefore, for example, as for Hp 30 nm, a proper film thickness is 5 to 25 Å, and the best film thickness is 15 Å.

<Second Photoresist Pattern Forming Process>

In the second photoresist pattern forming process, the second photoresist pattern 603b is formed on the $SiO_2$ film 604, which is formed on the first photoresist in the first photoresist protection film forming process, at a position different from the position where the first photoresist pattern 603a is formed. This process also proceeds in the same manner as the first photoresist pattern forming process. At first, a second photoresist solvent 602b is coated on the $SiO_2$ film 604 which is the first photoresist protection film (FIG. 4d). Thereafter, the second photoresist pattern 603b is formed by performing baking, exposure and development by ArF excimer light source (193 nm) or KrF excimer light source (248 nm) (FIG. 4e).

Figure 6:
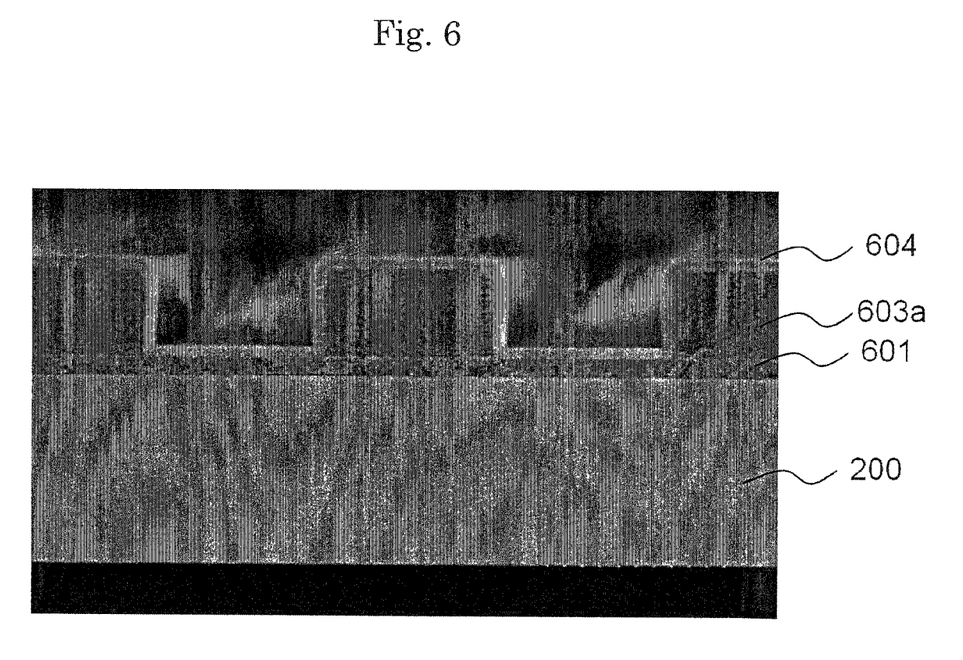
FIG. 6 is a diagram showing the case where a $SiO_2$ film is formed by an ALD method, in a preferred embodiment of the present invention.

As mentioned above, fine photoresist pattern is formed by the first photoresist pattern forming process, the first photoresist protection film forming process and the second photoresist pattern forming process. FIG. 6 shows the formation of the $SiO_2$ film by using the ALD method.

Although it has been explained above that the first photoresist pattern 603a is formed on the hard mask formed on the wafer 200, the hard mask 601 may be omitted.

In addition, after the second photoresist pattern forming process, predetermined processing (for example, dimension inspection, correction inspection, rework processing, and the like) is performed and, if necessary, a first photoresist protection film removing process may be performed for removing the $SiO_2$ film 604.

<First Photoresist Protection Film Removing Process>

In the first photoresist protection film removing process, the $SiO_2$ film 604 as the first photoresist protection film formed in the first photoresist protection film forming process is removed.

As the removing method, there are two methods: a wet etching method and a dry etching method. In the case of removing the $SiO_2$ film 604 by the wet etching method, an HF diluted solution as a hydrogen fluoride (HF) solution is used as an etching solution. The $SiO_2$ film formed by the ALD method is etched at a fast wet etching rate. FIG. 7 shows comparison of etching rates of $SiO_2$ films formed by other method, as their characteristics. As can be seen from FIG. 7, in the case where a wet etching rate of a thermal oxide film is used as reference, the $SiO_2$ film formed by the CVD method has 5 times the wet etching rate of the thermal oxide film, and the $SiO_2$ film formed by the ALD method has 15 times the wet etching rate of the thermal oxide film, so that the wet etching rate of the $SiO_2$ film formed by the ALD method is faster.

Moreover, although the above explanation has been given on the process of forming the photoresist pattern two times, the photoresist pattern may be formed three or more time and, in this case, the photoresist pattern forming process and the photoresist protection film forming process are repetitively performed predetermined times.

In the case where the photoresist pattern is formed three or more times, if necessary, the protection film may be removed one by one in the following sequence: the first photoresist pattern forming process→the first photoresist protection film forming process→the second photoresist pattern forming process→the first photoresist protection film removing process→the third photoresist pattern forming process→the second photoresist protection film forming process→the fourth photoresist pattern forming process→the second photoresist protection film removing process→the fifth photoresist pattern forming process→ . . . .

By using, for example, TDMAS, DCS, HCD or TCS as the Si material and using, for example, $H_2O$, $H_2O_2$, $O_2$ or $O_3$ as the oxidation material, the Si material and the oxidation material are supplied alternately by the ALD method, and the $SiO_2$ film of desired film thickness can be formed by repeating the alternate supply a plurality of times. Therefore, the $SiO_2$ film 604 as the first photoresist protection material can be formed at low temperature.

As mentioned above, by forming the thin film on the surface of the first photoresist pattern, the first photoresist pattern can be protected and, when the second photoresist solvent is coated, the second photoresist solvent can be prevented from penetrating into the first photoresist pattern.

Furthermore, as mentioned above, since the penetration of the second photoresist solvent into the first photoresist pattern is prevented, the second photoresist pattern can be formed in a region where the first photoresist pattern is not formed, and it is possible to form fine photoresist pattern with a minimum spacing of 50 nm or less between the first photoresist pattern and the second photoresist pattern.

Moreover, by forming the thin film on the surface of the first photoresist pattern, mechanical strength of the first photoresist pattern can be improved in the second photoresist pattern forming process.

A thin film that can undergo a process at an extremely low temperature, such as an extremely low temperature (catalyst) $SiO_2$ film formed by using catalyst, can be used as the first photoresist protection film. In this case, since the thin film is formed at temperature lower than the photoresist deformation temperature, deformation of the first photoresist pattern can be prevented in the first photoresist protection film forming process.

As for the $SiO_2$ film, the fast wet etching rate is so fast that the $SiO_2$ film can be easily removed.

In the photoresist processing, typically, errors such as misalignment in position of the under layer or misalignment in dimension thereof occur frequently and, in this case, the photoresist pattern is removed through an ashing process by using oxygen plasma or the like, and a rework process of resuming the photoresist pattern forming process from the beginning shall be carried out, but the rework process of the second photoresist pattern has a problem that the first photoresist pattern is damaged by oxygen plasma or the like. However, as mentioned above, by forming the thin film such as $SiO_2$ film which can endure the ashing process by oxygen plasma on the first photoresist pattern, the first photoresist pattern can be protected in the rework process of the second photoresist pattern.

Moreover, in forming the second photoresist pattern, it is required to detect alignment mark, which is formed on the wafer, for position alignment with the under pattern. Therefore, the thin film as the first photoresist protection film is required to be transparent.

In the above-mentioned embodiment, the above explanation has been given on the extremely low temperature $SiO_2$ film formed using the Si material, the oxidation material and the catalyst by the ALD method, the first photoresist protection film is not limited to the extremely low temperature $SiO_2$ film, but other film forming methods and other kinds of films can also be applied if film is formed at temperature where deformation of the first photoresist pattern is prevented. For example, film forming technologies using light energy, such as a film forming method which induces a predetermined reaction by radiating ultraviolet rays to the source gas, can be applied.

Furthermore, in the above-mentioned embodiment, the vertical type substrate processing apparatus has been explained as an example in forming the thin film in the first photoresist protection film forming process, but the present invention can also be applied to a single wafer type processing apparatus.

Moreover, in the above-mentioned embodiment, the substrate processing apparatus forming a thin film has been explained as an example of the semiconductor manufacturing apparatus, but the semiconductor manufacturing apparatus may further include a photoresist processing apparatus forming photoresist pattern, as well as the substrate processing apparatus. Therefore, the photoresist pattern formation and the film formation can be batch-processed.

According to the first manufacturing method of the semiconductor device, relevant to one aspect of the present invention, by forming the thin film (for example, $SiO_2$ film) on the first photoresist pattern, the first photoresist pattern is protected and, when the second photoresist solvent is coated, the second photoresist solvent is prevented from penetrating into the first photoresist pattern. By protecting the photoresist at temperature lower than the first photoresist deformation temperature, the thin film for protecting the first photoresist pattern can be formed while preventing the deformation of the first photoresist pattern.

Furthermore, according to the first manufacturing method of the semiconductor device, relevant to an aspect of the present invention, by forming the thin film on the first photoresist pattern, the mechanical strength of the first photoresist pattern can be improved in the second photoresist pattern formation.

According to the first manufacturing method of the semiconductor device, relevant to an aspect of the present invention, the $SiO_2$ film has a fast wet etching rate; therefore, if using the $SiO_2$ film as the first photoresist pattern protection film, it can be easily removed.

Furthermore, according to the first manufacturing method of the semiconductor device, relevant to an aspect of the present invention, by forming the thin film (for example, $SiO_2$ film) on the first photoresist pattern, the first photoresist pattern can be protected during the rework of the second photoresist pattern.

Moreover, according to the semiconductor manufacturing method relevant to an aspect of the present invention, by forming the thin film (for example, $SiO_2$ film) on the first photoresist pattern, the first photoresist pattern can be protected and, when the second photoresist solvent is coated, the second photoresist solvent is prevented from penetrating into the first photoresist pattern. In addition, by forming the thin film at extremely low temperature lower than the first photoresist deformation temperature at which the first photoresist pattern is formed, the thin film for protecting the first photoresist pattern can be formed while preventing the deformation of the first photoresist pattern.

Moreover, according to the semiconductor manufacturing apparatus relevant to an aspect of the present invention, the semiconductor manufacturing apparatus includes the photoresist processing apparatus forming the photoresist pattern, and the substrate processing apparatus forming the thin film, so that the photoresist pattern formation and the film formation can be batch-processed.

Moreover, according to the semiconductor manufacturing apparatus relevant to an aspect of the present invention, by forming the thin film (for example, $SiO_2$ film) on the first photoresist pattern, the first photoresist pattern can be protected during the rework of the second photoresist pattern.

(Supplementary Note)

The present invention also includes the following embodiments.

(Supplementary Note 1)

According to an embodiment of the present invention, there is provided a manufacturing method of the semiconductor device, comprising: forming a first photoresist pattern in a predetermined region on a substrate; depositing a thin film on the surface of at least the first photoresist pattern; and forming a second photoresist pattern in a region where the first photoresist pattern is not formed.

(Supplementary Note 2)

In the manufacturing method of Supplementary Note 1, it is preferable that the thin film is formed at processing temperature lower than a deformation temperature of a first photoresist forming the first photoresist pattern.

(Supplementary Note 3)

In the manufacturing method of Supplementary Note 1, it is preferable that the thin film is deposited, over the substrate, on the surface of the first photoresist pattern and the region where the first photoresist pattern is not formed.

(Supplementary Note 4)

In the manufacturing method of Supplementary Note 1, it is preferable that the a plurality of first patterns is formed in the predetermined region on the substrate, and the thin film is deposited on at least the top and side of the plurality of first photoresist patterns, so that a minimum spacing of opposite parts of the thin film surface formed in the side is larger than width of the first photoresist pattern.

(Supplementary Note 5)

In the manufacturing method of Supplementary Note 4, it is preferable that the second photoresist pattern is formed with a minimum spacing of 50 nm or less from the first photoresist pattern.

(Supplementary Note 6)

In the manufacturing method of Supplementary Note 1, it is preferable that the thin film is deposited at processing temperature of 150° C. or less.

(Supplementary Note 7)

In the manufacturing method of Supplementary Note 6, it is preferable that the thin film is formed at processing temperature of 100° C. or less.

(Supplementary Note 8)

In the manufacturing method of Supplementary note 7, it is preferable that the thin film is deposited at processing temperature of 75° C.

(Supplementary Note 9)

In the manufacturing method of Supplementary Note 1, it is preferable that the thin film is transparent to visible rays.

(Supplementary Note 10)

In the manufacturing method of Supplementary Note 9, it is preferable that the thin film is a SiO2 film.

(Supplementary Note 11)

In the manufacturing method of Supplementary Note 10, it is preferable that the SiO2 film is deposited using a Si material, an oxidation material and a catalyst.

(Supplementary Note 12)

In the manufacturing method of Supplementary Note 11, it is preferable that the Si material is any one of TDMAS[tris-dimethylaminosilane, $SiH(N(CH_3)_2)_3$], DCS[dichlorosilane, $SiH_2Cl_2$], HCD[hexachlorodisilane, $Si_2Cl_6$], and TCS[tetrachlorosilane, $SiCl_4$].

(Supplementary Note 13)

In the manufacturing method of Supplementary Note 11, it is preferable that the oxidation material contains a plurality of atoms having different electronegativity among molecules.

(Supplementary Note 14)

In the manufacturing method of Supplementary Note 13, it is preferable that the oxidation material is one of $H2O$ and $H_2O_2$.

(Supplementary Note 16)

In the manufacturing method of Supplementary Note 11, it is preferable that decomposition temperature of the catalyst is higher than vaporization temperature of the oxidation material.

(Supplementary Note 16)

In the manufacturing method of Supplementary Note 11, it is preferable that the catalyst is any one of pyridine ($C_5H_5N$), pyrimidine ($C_4H_4N_2$), and quinoline ($C_9H_7N$).

(Supplementary Note 17)

It is preferable that the manufacturing method of Supplementary Note 1 further comprises: removing the second photoresist pattern by an ashing process using oxygen plasma, wherein the thin film has a composition with resistant property to the oxygen plasma.

(Supplementary Note 18)

In the manufacturing method of Supplementary Note 1, it is preferable that the thin film is deposited by using a substrate processing apparatus, the substrate processing apparatus comprising: a processing chamber for processing the substrate; a material supply unit for supplying a Si material, an oxidation material, and a catalyst into the processing chamber; and a controller for controlling at least the material supply unit, wherein the controller controls the material supply unit to alternately supply the Si material and the catalyst, and the oxidation material and the catalyst, into the processing chamber.

(Supplementary Note 19)

In the manufacturing method of Supplementary Note 1, it is preferable that the thin film is deposited by a substrate processing apparatus, the substrate processing apparatus comprising: a processing chamber for processing the substrate; a material supply unit for supplying a Si material, an oxidation material, and a catalyst into the processing chamber; a heating unit for heating the substrate; and a controller for controlling at least the material supply unit and the heating unit, wherein the controller controls the heating unit so that heating temperature of the substrate becomes a processing temperature lower than a deformation temperature of a first photoresist forming the first photoresist pattern, and the controller controls the material supply unit to alternately supply the Si material and the catalyst, and the oxidation material and the catalyst, into the processing chamber, and repeat the alternate supply a plurality of times.

(Supplementary Note 20)

It is preferable that the manufacturing method of Supplementary Note 1 further comprises, after the formation of the second photoresist pattern, removing the thin film.

(Supplementary Note 21)

In the manufacturing method of Supplementary Note 20, it is preferable that the thin film has a composition which is easily removable.

(Supplementary Note 22)

In the manufacturing method of Supplementary Note 20, it is preferable that the thin film is removed by a dry etching method.

(Supplementary Note 23)

In the manufacturing method of Supplementary Note 20, it is preferable that the thin film is a SiO2 film and is removed by a wet etching method using an HF diluted solution.

(Supplementary Note 24)

In the manufacturing method of Supplementary Note 1, it is preferable that the second photoresist pattern is formed by coating a second photoresist solvent, and the thin film has a composition which prevents penetration of the second photoresist solvent.

(Supplementary Note 25)

According to another embodiment of the present invention, there is provided a photoresist pattern forming method, comprising: forming a first photoresist pattern in a predetermined region on a substrate; depositing a thin film on the surface of at least the first photoresist pattern; and forming a second photoresist pattern in a region where the first photoresist pattern is not formed.

(Supplementary Note 26)

According to another embodiment of the present invention, there is provided a semiconductor device, manufactured by performing an etching process by using the first photoresist pattern and the second photoresist pattern, which are formed by using the photoresist pattern forming method of the Supplementary Note 25, as a mask, and performing a desired process on the substrate by processing under films of the first photoresist pattern and the second photoresist pattern.

(Supplementary Note 27)

In the semiconductor device of Supplementary Note 26, it is preferable that a minimum spacing between the first photoresist pattern and the second photoresist pattern is 50 nm or less.

(Supplementary Note 28)

In the manufacturing method of Supplementary Note 1, it is preferable that forming the second photoresist pattern comprises: forming a photoresist film by coating a photoresist solvent on the substrate where the first photoresist pattern and the thin film are formed; exposing the substrate using a predetermined mask pattern, and transferring a desired pattern by selectively exposing the photoresist film to light; and dipping the exposed substrate into a developer to remove the photoresist film which is an extra portion.

(Supplementary Note 29)

According to another embodiment of the present invention, there is provided a semiconductor manufacturing apparatus, comprising: a photoresist processing unit for forming a photoresist pattern in a predetermined region on a substrate to which a predetermined process is applied; and a substrate processing unit for forming a thin film on the surface of at least the photoresist pattern.

(Supplementary Note 30)

In the semiconductor manufacturing apparatus of Supplementary Note 29, it is preferable that the photoresist processing unit comprises: a first photoresist processing unit for forming a first photoresist pattern in the predetermined region on the substrate to which the predetermined process is applied; and a second photoresist processing unit for forming a second photoresist pattern in a region where the first photoresist pattern is not formed.

(Supplementary Note 31)

In the semiconductor manufacturing apparatus of Supplementary Note 29, it is preferable that the substrate processing unit comprises: a processing chamber for processing the substrate; a material supply unit for supplying a Si material, an oxidation material, an a catalyst into the processing chamber; a heating unit for heating the substrate; and a controller for controlling at least the material supply unit and the heating unit, wherein the controller controls the heating unit and the material supply unit to heat the substrate to processing temperature lower than a first photoresist deformation temperature, and to alternately supply the Si material and the catalyst, and the oxidation material and the catalyst, into the processing chamber, and repeat the alternate supply a plurality of times.

What is claimed is:

1. A manufacturing method of a semiconductor device, comprising steps of:
   forming a first photoresist pattern in a predetermined region on a substrate;
   depositing a thin film on the surface of at least the first photoresist pattern using a catalyst and at least two materials which includes a first material and a second material; and
   forming a second photoresist pattern in a region where the first photoresist pattern is not formed,
   wherein the step of depositing the thin film includes:
   supplying the catalyst and a first gas including the first material,
   supplying a purge gas to remove the first gas,
   supplying the catalyst and a second gas including the second material, and
   supplying the purge gas to remove the second gas.

2. The manufacturing method of claim 1, wherein the thin film is transparent to visible rays.

3. The manufacturing method of claim 2, wherein the thin film is a $SiO_2$ film.

4. The manufacturing method of claim 3, wherein the first material comprises a Si material and the second material comprises an oxidation material.

5. The manufacturing method of claim 4, wherein the Si material is one of trisdimethylaminosilane, $SiH(N(CH_3)_2)_3$ (TDMAS), dichlorosilane, $SiH_2Cl_2$ (DCS), hexachlorodisilane, $Si_2Cl_6$ (HCD), and tetrachlorosilane, $SiCl_4$ (TCS).

6. The manufacturing method of claim 4, wherein the oxidation material contains a plurality of atoms having different electronegativity among molecules.

7. The manufacturing method of claim 6, wherein the oxidation material is one of $H_2O$ and $H_2O_2$.

8. The manufacturing method of claim 4, wherein a decomposition temperature of the catalyst is higher than a vaporization temperature of the oxidation material.

9. The manufacturing method of claim 4, wherein the catalyst is one of pyridine ($C_5H_5N$), pyrimidine ($C_4H_4N_2$), and quinoline ($C_9H_7N$).

10. The manufacturing method of claim 1, wherein the thin film is deposited at a processing temperature of 150° C. or lower.

11. The manufacturing method of claim 10, wherein the thin film is deposited at the processing temperature of 100° C. or lower.

12. The manufacturing method of claim 11, wherein the thin film is deposited at the processing temperature of 75° C.

13. The manufacturing method of claim 1, wherein a plurality of first patterns is formed in the predetermined region on the substrate, and the thin film is deposited on at least a top and a side of the plurality of first photoresist patterns so that a minimum spacing of opposite parts of the thin film surface formed at the side is larger than width of the first photoresist pattern.

14. The manufacturing method of claim 13, wherein the second photoresist pattern is formed with the minimum spacing of 50 nm or less from the first photoresist pattern.

15. The manufacturing method of claim 1, further comprising removing the thin film after forming the second photoresist pattern.

16. The manufacturing method of claim 15, wherein the thin film has a composition which is removable.

17. The manufacturing method of claim 15, wherein the thin film is removed by a dry etching method.

18. The manufacturing method of claim 15, wherein the thin film is a $SiO_2$ film and is removed by a wet etching method using a diluted HF solution.

19. The manufacturing method of claim 1, wherein the thin film is deposited at a processing temperature lower than a deformation temperature of a first photoresist constituting the first photoresist pattern.

20. The manufacturing method of claim 1, wherein the thin film is deposited, over the substrate, on the surface of the first photoresist pattern and the region where the first photoresist pattern is not formed.

21. The manufacturing method of claim 1, further comprising:
   removing the second photoresist pattern by an ashing process using an oxygen plasma, wherein the thin film has a composition with resistant property to the oxygen plasma.

22. The manufacturing method of claim 1, wherein the thin film is deposited using a substrate processing apparatus, the substrate processing apparatus comprising:
- a processing chamber for processing the substrate;
- a material supply unit for supplying a Si material, an oxidation material and the catalyst into the processing chamber; and
- a controller for controlling at least the material supply unit,
- wherein the controller controls the material supply unit to alternately supply the Si material and the catalyst, and the oxidation material and the catalyst, into the processing chamber.

23. The manufacturing method of claim 1, wherein the thin film is deposited by a substrate processing apparatus, the substrate processing apparatus comprising:
- a processing chamber for processing the substrate;
- a material supply unit for supplying a Si material, an oxidation material and the catalyst into the processing chamber;
- a heating unit for heating the substrate; and
- a controller for controlling at least the material supply unit and the heating unit,
- wherein the controller controls the heating unit such that heating temperature of the substrate becomes a processing temperature lower than a deformation temperature of a first photoresist constituting the first photoresist pattern, and the controller controls the material supply unit to alternately supply the Si material and the catalyst, and the oxidation material and the catalyst into the processing chamber, and repeat the alternate supply a plurality of times.

24. The manufacturing method of claim 1, wherein the second photoresist pattern is formed by coating a second photoresist solvent, and the thin film has a composition such that a penetration of the second photoresist solvent is prevented.

25. The manufacturing method of claim 1, wherein the step of forming the second photoresist pattern comprises:
- forming a photoresist film by coating a photoresist solvent on the substrate where the first photoresist pattern and the thin film are formed;
- selectively exposing the photoresist film to light using a predetermined mask pattern to transfer a desired pattern; and
- dipping the exposed substrate into a developer to remove an extra portion of the photoresist film.

26. The manufacturing method of claim 1, wherein a thickness of the thin film is 5% of a half pitch.

27. The manufacturing method of claim 1, wherein the thin film is deposited at a processing temperature lower than a deformation temperature of a first photoresist constituting the first photoresist pattern.

28. A photoresist pattern forming method, comprising steps of:
- forming a first photoresist pattern in a predetermined region on a substrate;
- depositing a thin film on the surface of at least the first photoresist pattern using a catalyst and at least two materials which includes a first material and a second material; and
- forming a second photoresist pattern in a region where the first photoresist pattern is not formed,
- wherein the step of depositing the thin film includes:
- supplying the catalyst and a first gas including the first material,
- supplying a purge gas to remove the first gas,
- supplying the catalyst and a second gas including the second material, and
- supplying the purge gas to remove the second gas.

29. A semiconductor device manufactured by performing an etching process by using a first photoresist pattern and a second photoresist pattern formed by using a photoresist pattern forming method of claim 28 as a mask, and performing a desired process on a substrate by processing an under film of the first photoresist pattern and the second photoresist pattern.

30. The semiconductor device of claim 29, wherein a minimum spacing between the first photoresist pattern and the second photoresist pattern is 50 nm or less.

* * * * *